United States Patent
Sahota

Patent Number: 5,840,623
Date of Patent: *Nov. 24, 1998

[54] EFFICIENT AND ECONOMICAL METHOD OF PLANARIZATION OF MULTILEVEL METALLIZATION STRUCTURES IN INTEGRATED CIRCUITS USING CMP

[75] Inventor: Kashmir S. Sahota, Fremont, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 539,140

[22] Filed: Oct. 4, 1995

[51] Int. Cl.⁶ .................................................. H01L 21/4763
[52] U.S. Cl. ......................... 438/624; 438/631; 438/632; 438/633; 438/639
[58] Field of Search ..................................... 437/195, 240, 437/235, 228; 156/636.1; 451/41; 438/624, 631, 632, 633, 639

[56] References Cited

U.S. PATENT DOCUMENTS

| | | | |
|---|---|---|---|
| 4,910,155 | 3/1990 | Cote et al. | 437/8 |
| 4,954,459 | 9/1990 | Avanzino et al. | 437/228 |
| 5,175,122 | 12/1992 | Wang et al. | 437/67 |
| 5,312,512 | 5/1994 | Allman et al. | 156/636 |
| 5,382,547 | 1/1995 | Sultan et al. | 437/231 |
| 5,445,998 | 8/1995 | Zimmer | 437/228 |
| 5,508,233 | 4/1996 | Yost et al. | 437/228 |
| 5,639,697 | 6/1997 | Weiling et al. | 438/633 |
| 5,728,595 | 3/1998 | Fukase | 438/241 |

FOREIGN PATENT DOCUMENTS

| | | | |
|---|---|---|---|
| 0 405 850 A2 | 6/1990 | European Pat. Off. | H01L 21/31 |
| 0 405 850 A3 | 6/1990 | European Pat. Off. | H01L 21/90 |
| 42 21 431 A1 | 6/1992 | Germany | H01L 27/108 |

*Primary Examiner*—Olik Chuadhuri
*Assistant Examiner*—Lynne A. Gurley
*Attorney, Agent, or Firm*—Sawyer & Associates

[57] ABSTRACT

A method for increasing the oxide removal rate of oxide chemical-mechanical polishing is provided for planarizing dielectric layers. The method of the invention is employed in the process for forming multilayer interconnects. The process employs doped oxide deposition and polish processing instead of undoped oxide deposition and polish. Doped oxides such as BPTEOS (boron phosphorous tetra-ethyl orthosilicate), BSG (boron silane-based glass), PSG (phosphorous silane-based glass), and BPSG (boron phosphorous silane-based glass) can be used. The polish rate of doped oxide film is 2 to 3 times the polish rate of undoped oxide film. By forming the planarized dielectric layers from doped oxide films, the throughput of the CMP process step is increased thus reducing the cost of manufacturing.

12 Claims, 2 Drawing Sheets

EFFICIENT AND ECONOMICAL METHOD OF PLANARIZATION OF MULTILEVEL METALLIZATION STRUCTURES IN INTEGRATED CIRCUITS USING CMP

TECHNICAL FIELD

The present invention relates generally to semiconductor processing, and, more particularly, to improving the throughput and reducing the cost of oxide chemical mechanical polishing (CMP) for 0.7 micrometer and smaller semiconductor devices.

BACKGROUND ART

To accommodate higher packing density in present integrated circuits, metal connection to integrated circuit devices formed in a semiconductor substrate are made by multilayer interconnects. Each level of multilayer interconnects is supported over the semiconductor substrate by an interlevel dielectric. Generally, the integrated circuit structure is coated with a dielectric layer and metal lines are laid down in parallel strips on top of the dielectric layer. Additional levels of multilayer interconnects are formed over this dielectric layer each including additional metal interconnects and an interlevel dielectric layer.

Oxide chemical-mechanical polishing (CMP) is widely employed to planarize dielectric layers used to isolate the metal connections formed from layers of patterned metal deposited on semiconductor wafers. Oxide CMP is employed to convert a conformal oxide layer deposited over a layer of patterned metal, into a planar oxide surface. Without oxide CMN, the conformal oxide layer conforms to the shape of the layer of patterned metal. Fluctuations in the surface of the conformal oxide layer exist above metal steps in the layer of patterned metal. With oxide CMP, oxide on the surface of a wafer is removed, producing a planar layer of oxide above the metal steps.

For producing planarized oxide topographies, those skilled in the art use a PETEOS (plasma enhanced tetraethyl orthosilicate) film. The typical polish rate of PETEOS, however, ranges from 2,000 to 4,000 Å/minute.

In particular, an existing method used for the planarization of oxide topographies on integrated circuit structures is outlined in U.S. Pat. No. 4,954,459. The method described in this patent involves oxide deposition followed by masking with openings in the mask in registry with raised portions of the oxide, wet etch to etch the raised portions of the oxide down to approximately the same height as the low portions of the oxide, resist strip, and polish processing to remove remaining raised portions of the oxide. This process, however, involves additional masking and etching processes in addition to polishing processes and thus increases process complexity. Furthermore, the polish rate for the oxide is relatively slow.

What is needed is an approach for polishing wafers that provides a higher oxide removal rate, thus greatly improving CMP throughput.

DISCLOSURE OF INVENTION

In accordance with the invention, a method is provided for increasing the oxide removal rate of oxide chemical-mechanical polishing employed to planarize dielectric layers in the formation of multilayer interconnects for connecting conductive regions separated by insulating regions supported on a integrated circuit structure by forming the planarized dielectric layers from doped oxide films. The method comprises:

(a) depositing at least one conducting film on the integrated circuit structure;

(b) patterning and etching the conducting film to form conducting lines, some of which are separated by comparatively wide spaces and others of which are separated by comparatively narrow spaces therebetween;

(c) filling the narrow spaces by forming spacers therein;

(d) depositing at least one doped oxide film over the integrated circuit structure; and (e) polishing the doped oxide film using chemical-mechanical polishing to planarize the doped oxide film.

The above steps can be repeated to build multiple levels of metal interconnects.

The method of the invention enables the throughput of the oxide CMP process step to be increased. The method employs a doped oxide deposition and polishing process to replace the steps described in the above-mentioned disclosed art, i.e., U.S. Pat. No. 4,954,459. In the present invention, doped oxides such as BPTEOS (boron phosphorous tetraethyl orthosilicate), BSG (boron silane-based glass), PSG (phosphorous silane-based glass), and BPSG (boron phosphorous silane-based glass), are used. The concentration of B and/or P in these doped oxide films may vary from about 1 to 5%. The polish rate of doped oxide film is 2 to 3 times the polish rate of undoped oxide film. Accordingly, employing doped oxide film increases the polish throughput hence reducing the cost of manufacturing.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1:
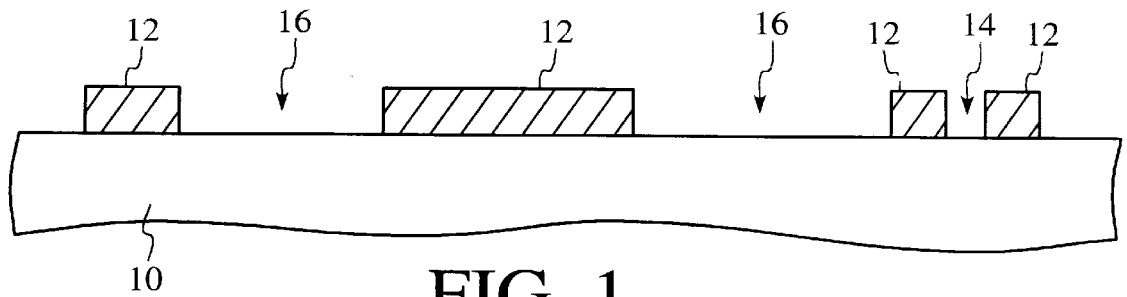
FIG. 1 is a cross-sectional view depicting metal lines formed on the integrated circuit structure.

Referring now to FIG. 1, wherein like reference numerals designate like elements throughout, an integrated circuit structure 10 is depicted having conducting lines or metal lines 12 formed thereon. While four metal lines 12 are shown, it will be readily apparent to those skilled in the art that in fact any number of such metal lines can be employed. Additionally, the process of the present invention applies to polysilicon lines as well. To form the metal lines 12, a metal film is first deposited or sputtered on the integrated circuit structure 10. The metal film is then masked with a metal mask using photoresist (not shown) followed by metal etch using an RIE (reactive ion etch) etcher. The photoresist is then stripped using plasma resist strip and wet strip processes. This process described above defines the metal lines 12 and spaces, both narrow spaces 14 and wide spaces 16, between the metal lines. While one narrow space 14 is shown, it will be readily apparent to those skilled in the art that in fact any number of such narrow spaces will exist. The metal lines 12 and spaces could vary from minimum feature width to as wide as required by metal design rules. As used herein, narrow spaces are defined as having a width of less than about 0.8 μm, while wide spaces are defined as having a width of greater than about 0.8 μm.

Figure 2:
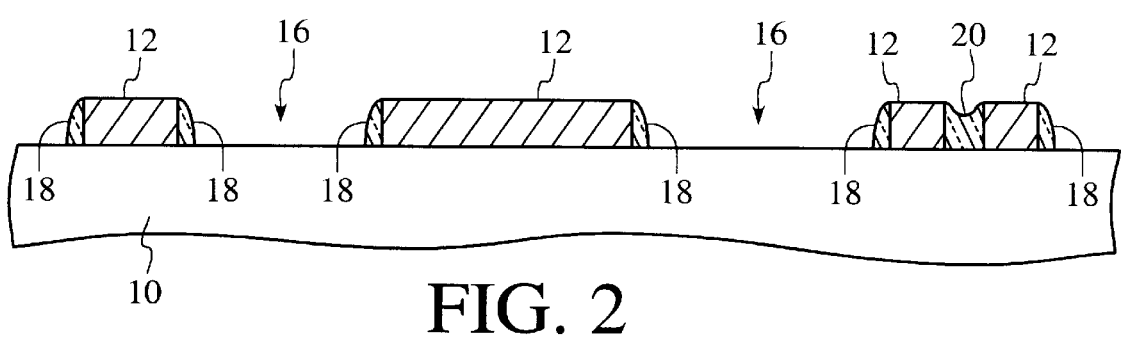
FIG. 2 is a cross-sectional view depicting spacer formation or gap fill in the narrow spaces.

The narrow spaces 14 between metal lines 12 can be filled using a technique for spacer formation or gap fill such as defined in U.S. Pat. No. 5,382,547. In the process described in this patent, oxide fillets 18, which are shown in FIG. 2, are formed on the sidewalls of the metal lines 12. These oxide fillets 18 may be formed by applying a layer of oxide (not shown) such as CVD (chemical vapor deposited) PETEOS oxide over the metal lines 12. Next, a layer of hardenable sacrificial spin-on-glass (SOG) material (not shown) is applied over the layer of oxide. An RIE etchback is performed after the spacer deposition (i.e., the deposition of the layer of oxide and the layer of hardenable SOG) clearing the top of the metal lines 12. The layer of hardenable SOG is used to slow down the etch rate in the narrow spaces 14 enabling the formation of spacers 20 therein. The etchback with RIE is employed until all of the layer of hardenable sacrificial SOG material and nearly all of the layer of oxide is removed thus forming the oxide fillets 18 on the sidewalls of the metal lines 12 and spacers 20 in the narrow spaces 14. This process, described in U.S. Pat. No. 5,382,547 and outlined above, ensures that there are no voids in oxide fill for spaces less than 0.8 μm wide.

Other existing techniques for spacer formation, such as ECR (electron cyclotron resonance) oxide dep-etch-dep (deposit-etch-deposit) or use of low $\epsilon$ (i.e., low dielectric constant) dielectric materials, may be employed as well.

Figure 3:
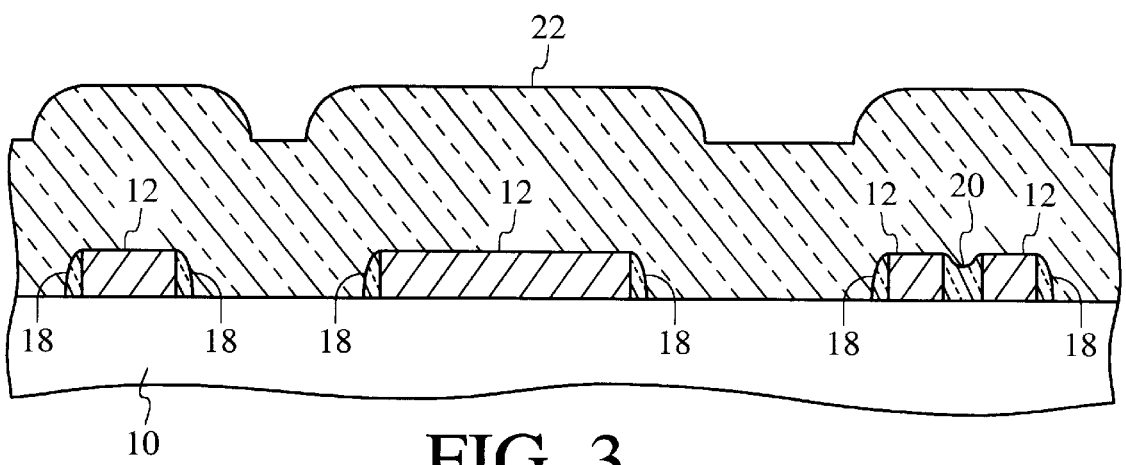
FIG. 3 is a cross-sectional view depicting the dope oxide film formed over the integrated circuit structure.

A doped glass film (or doped oxide film) 22 comprising doped oxide such as BPTEOS, PSG, BSG, or BPSG is then deposited as shown in FIG. 3. The doped oxide film is deposited using commercially available equipment, e.g. Applied P-5000 (Applied Materials, Santa Clara, Calif.) or Novellus Concept 1 (Novellus Inc., San Jose, Calif.). This process ensures that the wide spaces 16 between the metal lines 12 are filled about 0.5 to 2.0 μm above the original metal surface.

The concentration of the dopant (boron and/or phosphorus) in the doped glass film 22 is within the range of about 1 to 5%.

Figure 4:
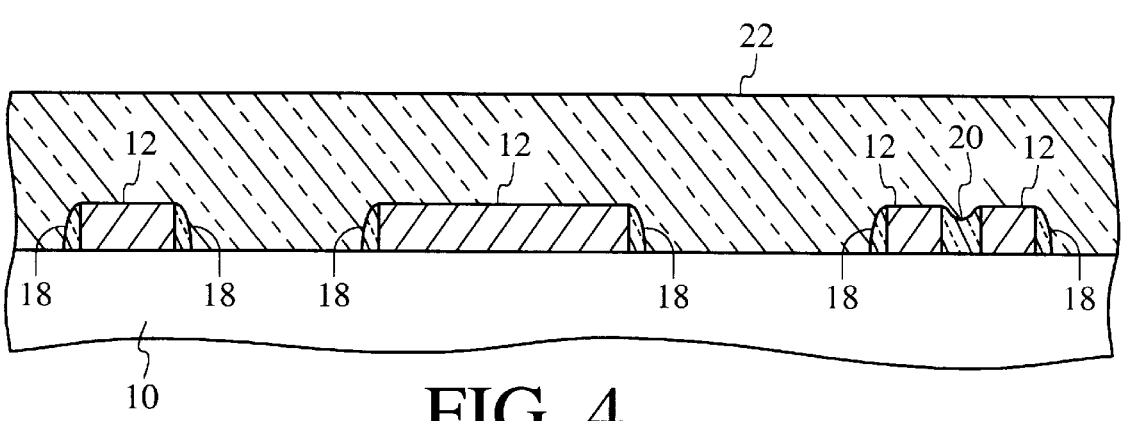
FIG. 4 is a cross-sectional view depicting the surface of the doped oxide film after oxide CMP.

The doped oxide film 22 is next polished such that all the topography on the surface has been planarized as depicted in FIG. 4. The doped oxide film 22 is polished using commercially available polishers, e.g., Westech 472 (IPEC/Westech Inc., Phoenix, Ariz.), Strasbaugh Planarizer (R. H. Strasbaugh Co., San Luis Obispo, Calif.), or Speedfam V (Speedfam Corp., Chandler, Ariz.).

The state of the art method of performing oxide CMP involves polishing a wafer supported in a wafer-carrier head or carrier with a polishing pad mounted on a polishing platen or platen. During polish, the wafer is caught between the carrier and the polish pad. Both the carrier and the platen rotate during polish.

The optimum time to completely planarize the topography on the surface of the doped oxide film 22 is usually the time required to polish blanket oxide film, i.e., an undoped oxide film, having a thickness equivalent 1 to 1.25 times the metal step height of the metal lines 12. Use of the doped glass film 22 having the boron and/or phosphorus concentration given above increases the polish throughput by 2 to 3 times.

The steps listed above, beginning with the formation of a metal film on the integrated circuit structure 10, can be repeated to build multiple levels of metal interconnects. In this manner doped glass films 22 can be formed over the first, second, third, fourth, fifth, and higher metal layers (i.e., metal layer 1, 2, 3, 4, 5, etc.).

EXAMPLE

As described above, the typical polish rate of PETEOS ranges from 2,000 to 4,000 Å/minute. In contrast, the polish rate of a doped glass film or doped oxide film 22 such as BPTEOS is higher for most CMP conditions as shown in Table I, which lists the polish rates and percent within wafer uniformity (%WIW uniformity) for BPTEOS. Thus, it is clear that judicious selection of polish conditions can provide removal rates on the order of 2 to 3 times the typical polish rate, that is, removal rates in the range of greater than 4,000 to over 12,000 Å/minute.

TABLE I

RUN SUMMARY FOR BPTEOS POLISH

| Example | Pressure (psi) | Platen Rotation (RPM) | Carrier Rotation (RPM) | Removal Rate (Å/min) | WIW Uniformity % |
|---|---|---|---|---|---|
| 1 | 6.0 | 10 | 10 | 2,874 | 6.2 |
| 2 | 10.0 | 45 | 10 | 12,172 | 5.2 |
| 3 | 10.0 | 10 | 45 | 4,871 | 6.8 |
| 4 | 6.0 | 45 | 45 | 7,810 | 7.8 |
| 5 | 10.0 | 10 | 10 | 4,452 | 3.9 |
| 6 | 6.0 | 10 | 45 | 3,401 | 15.4 |
| 7 | 6.0 | 45 | 10 | 7,633 | 7.2 |
| 8 | 8.0 | 10 | 10 | 3,684 | 6.5 |
| 9 | 6.0 | 28 | 10 | 6,083 | 5.7 |

Figure 5:
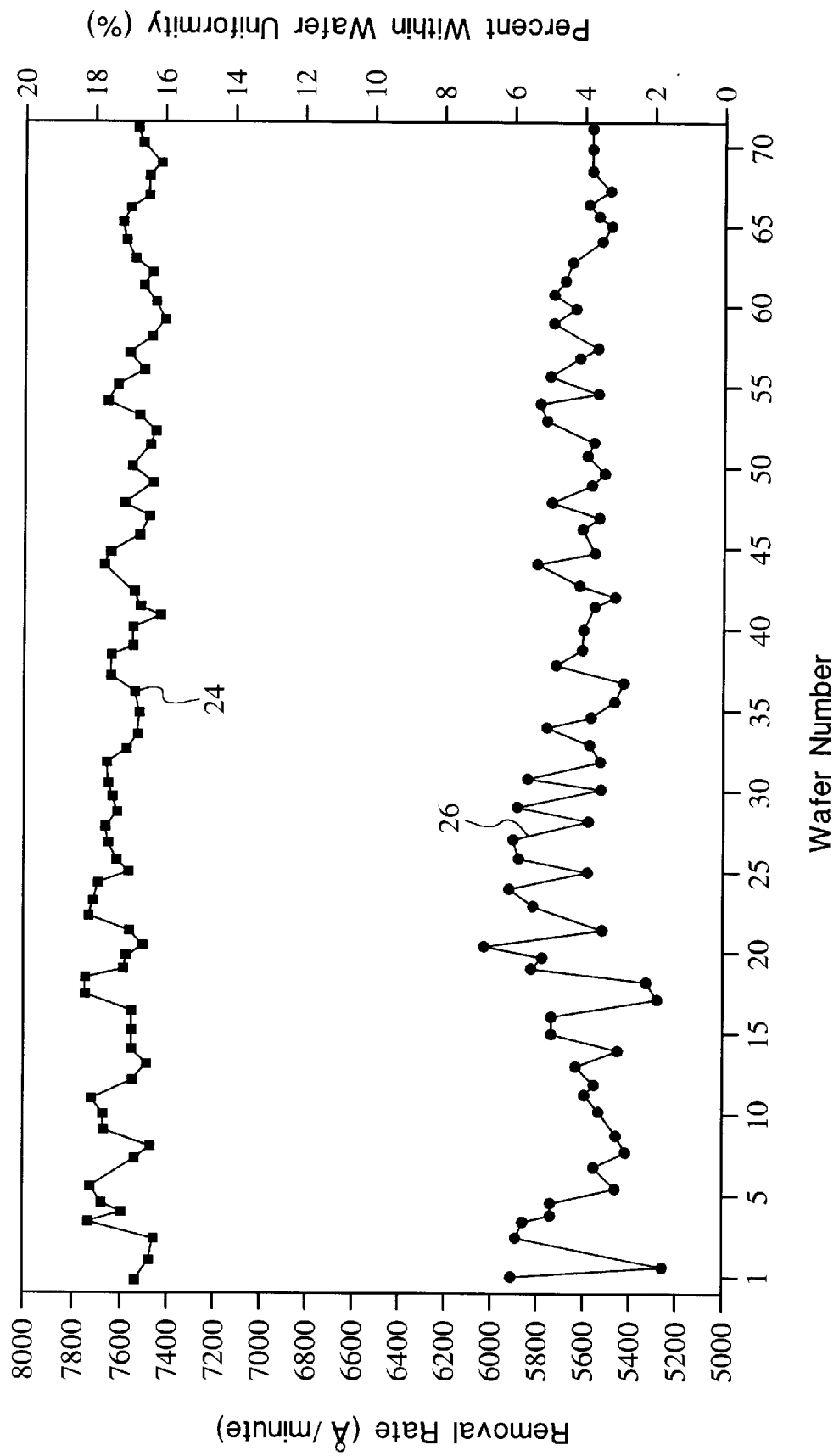
FIG. 5, on coordinates of removal rate (in Å/minute), percent within wafer uniformity (in percent), and wafer number, are two plots showing the removal rate and percent within wafer uniformity (%WIW uniformity) for a mini-marathon run of BPTEOS polish for 72 wafers.

Additionally, the removal rate (curve 24) of the doped oxide film 22 and %WIW uniformity (curve 26) for a mini-marathon run of a 6 inch BPTEOS polish are plotted and shown in FIG. 5. The %WIW uniformity is based on the <1σ> standard deviation over each wafer. The polish was performed using a Westech 472 polisher set at a pressure of 10 psi and using a 200 ml slurry flow. The platen rotation and carrier rates were 20 rpm and 15 rpm, respectively. The average removal rate of the doped oxide film 22 and %WIW uniformity, as shown in FIG. 5, are 7596 Å±63 Å and 4.1%±1%, respectively; the ± range indicating the <1σ> standard deviation over all 72 runs. Removal rates up to 12,000 Å/min, however, can be achieved as well, as shown in Table 1.

INDUSTRIAL APPLICABILITY

The process for increasing the oxide removal rate of oxide chemical-mechanical polishing employed to planarize dielectric layers in the formation of multilayer interconnects of the invention is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bi-polar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for increasing the oxide removal rate of oxide chemical-mechanical polishing employed to planarize dielectric layers in an integrated circuit structure by forming said planarized dielectric layers from doped oxide films, said method comprising:

(a) depositing at least one conducting film on said integrated circuit structure;

(b) patterning and etching said conducting film to form conducting lines, some of which are separated by comparatively wide spaces and others of which are separated by comparatively narrow space therebetween;

(c) filling said narrow spaces by forming spacers therein, and forming spacers in said comparatively wide spaces to form partially filled comparatively wide spaces;

(d) depositing only one doped oxide film over said spacers in said narrow spaces and said spacers in said comparatively wide spaces and over said integrated circuit structure to completely fill said partially filled comparatively wide spaces; and (e) polishing said doped oxide film using chemical-mechanical polishing to planarize said dope oxide film, wherein the doped oxide film substantially increases the rate of planarization.

2. The method of claim 1 wherein said conducting film and said conducting lines comprise conducting material selected from the group of conductors consisting of metal and polysilicon.

3. The method of claim 1 wherein said doped oxide film comprise doped oxide selected from the group consisting of boron phosphorous tetra-ethyl orthosilicate, boron silane-based glass, phosphorous silane-based glass, and boron phosphorous silane-based glass.

4. The method of claim 3 wherein said doped oxide film includes a concentration of boron ranging from about 1 to 5%, a concentration of phosphorous ranging from about 1 to 5%, or a concentration of boron and phosphorous ranging from about 1 to 5%, such that the concentration of boron and/or phosphorous increase the rate of planarization of the doped oxide film.

5. The method of claim 1 wherein steps (a) through (e) are repeated at least once to build multiple levels of metal interconnects.

6. The method of claim 5 wherein said multiple levels of metal interconnects are employed in the formation of multilayer interconnects for connecting conductive regions separated by insulating regions supported on said integrated circuit structure.

7. The method of claim 1 wherein said wide spaces are filled with said doped oxide film to a thickness above said conducting lines of about 0.5 to 2.0 micrometers.

8. The method of claim 1 wherein said narrow spaces are less than about 0.8 micrometers wide.

9. The method of claim 1 wherein said spacers are formed in said narrow spaces by electron cyclotron resonance oxide deposit-etch-deposit.

10. The method of claim 1 wherein said spacers are formed in said narrow spaces with low dielectric constant dielectric materials.

11. The method of claim 1 wherein said spacers are formed in said narrow spaces by a method comprising:

(a) forming a first layer of oxide over said conducting lines;

(b) forming a layer of hardenable sacrificial spin-on-glass material over said first layer of oxide; and (c) simultaneously etching said first layer of oxide and said hardenable sacrificial spin-on-glass material until essentially all of said hardenable sacrificial spin-on-glass material and nearly all of said first layer of oxide are removed.

12. The method of claim 1 wherein said spacers formed in said narrow spaces comprise essentially undoped oxide.

* * * * *